(12) United States Patent
Kramm et al.

(10) Patent No.: US 12,072,354 B2
(45) Date of Patent: Aug. 27, 2024

(54) CURRENT-SENSING RESISTOR

(71) Applicant: Isabellenhuette Heusler GmbH & Co. KG, Dillenburg (DE)

(72) Inventors: Benedikt Kramm, Wettenberg (DE); Felix Lebeau, Herborn (DE); Sven Thomas, Haiger (DE)

(73) Assignee: Isabellenhuette Heusler GmbH & Co. KG, Dillenburg (DE)

( * ) Notice: Subject to any disclaimer, the term of this patent is extended or adjusted under 35 U.S.C. 154(b) by 129 days.

(21) Appl. No.: 17/921,566

(22) PCT Filed: Feb. 5, 2021

(86) PCT No.: PCT/EP2021/052737
§ 371 (c)(1),
(2) Date: Oct. 26, 2022

(87) PCT Pub. No.: WO2021/219263
PCT Pub. Date: Nov. 4, 2021

(65) Prior Publication Data
US 2023/0168281 A1 Jun. 1, 2023

(30) Foreign Application Priority Data
Apr. 29, 2020 (DE) .......................... 102020111634.9

(51) Int. Cl.
*G01R 1/20* (2006.01)
(52) U.S. Cl.
CPC .................................. *G01R 1/203* (2013.01)

(58) Field of Classification Search
CPC ........... G01R 19/10; G01R 1/203; G01K 7/16; H01C 17/00
See application file for complete search history.

(56) References Cited

U.S. PATENT DOCUMENTS

| 5,999,085 | A | * | 12/1999 | Szwarc | ..................... | H01C 7/13 |
| | | | | | | 338/309 |
| 6,181,234 | B1 | * | 1/2001 | Szwarc | .................. | H01C 1/144 |
| | | | | | | 338/53 |
| 8,884,733 | B2 | | 11/2014 | Hetzler | | |
| 10,151,779 | B2 | | 12/2018 | Hetzler | | |

(Continued)

FOREIGN PATENT DOCUMENTS

| DE | 102013005939 A1 | 10/2014 |
| EP | 0605800 A1 | 7/1994 |
| WO | WO2012/019784 A1 | 2/2012 |

OTHER PUBLICATIONS

English abstract of EP0605800A1.
International Search Report from related PCT Application No. PCT/EP2021/052737 dated May 6, 2021.

*Primary Examiner* — Alvaro E Fortich
(74) *Attorney, Agent, or Firm* — Caesar Rivise, PC

(57) ABSTRACT

The invention relates to a current-sensing resistor for measuring an electric current (I), comprising two connection parts, a resistor element, a pair of voltage-sensing contacts for measuring a voltage drop across the resistor element, and at least one incision in at least one of the connection parts, the incision surrounding one of the voltage-sensing contacts and preventing current flow across the incision. The invention provides for multiple pairs of voltage sensing contacts to be arranged in series in the direction of current flow.

18 Claims, 5 Drawing Sheets

(56) References Cited

U.S. PATENT DOCUMENTS

| | | | | |
|---|---|---|---|---|
| 2004/0012480 A1* | 1/2004 | Nakamura | ............ | H01C 1/144 |
| | | | | 338/328 |
| 2013/0181807 A1* | 7/2013 | Hetzler | .................. | H01C 7/06 |
| | | | | 338/7 |
| 2016/0041206 A1* | 2/2016 | Hetzler | ............... | G01R 35/005 |
| | | | | 324/126 |
| 2016/0077135 A1 | 3/2016 | Jockel et al. | | |

* cited by examiner

CURRENT-SENSING RESISTOR

CROSS-REFERENCE TO RELATED APPLICATIONS

This application is a U.S. National Phase Application under 35 U.S.C. § 371 of PCT/EP2021/052737, filed Feb. 5, 2021, which claims priority from German Patent Application No. 10 2020 111 634.9, filed Apr. 29, 2020, the contents of which applications are incorporated herein by reference in their entireties.

BACKGROUND OF THE INVENTION

The invention relates to a current-sensing resistor for measuring an electric current according to the four-wire technique.

Such a current-sensing resistor is known in principle from WO 2012/019784 A1. This known current-sensing resistor consists essentially of a plate-shaped resistor element made of a resistor alloy (e.g. Manganin®) and two likewise plate-shaped connection parts made of a conductor material (e.g. copper), the two connection elements being welded to the resistor element on opposite sides of the resistor element. The electric current to be measured is introduced into the current-sensing resistor and discharged from the current-sensing resistor via the two connection parts, so that the electric current to be measured flows through the resistor element of the current-sensing resistor. Two voltage-sensing contacts are mounted in the two connection parts at the boundaries to the resistor element in order to measure the voltage drop across the resistor element. The measured voltage drop then corresponds to the electric current flowing through the current-sensing resistor according to Ohm's law. In addition, the known current-sensing resistor has two arc-shaped incisions in the connection parts, which surround the voltage-sensing contacts in an arc shape and are also referred to as current shadows. These current shadows improve the temperature dependence of the measurement. However, the known current-sensing resistor described above is not yet optimal in terms of measurement accuracy.

The invention is therefore based on the task of creating a correspondingly improved current-sensing resistor.

SUMMARY

This task is solved by a current-sensing resistor according to the main claim.

The invention includes the general technical teaching of providing not only one pair of voltage-sensing contacts, but several pairs of voltage-sensing contacts which are arranged one behind the other in the direction of current flow and can form several measuring channels. This can significantly improve the measurement accuracy of the current-sensing resistor. Thus, the multiple pairs of voltage-sensing contacts already physically enable multiple redundancy in the voltage measurement and verification of the current measurement.

First of all, the current-sensing resistor according to the invention has, in accordance with the known current-sensing resistor described at the beginning, a first connection part which consists of a conductor material (e.g. copper, copper alloy) and serves to introduce the electric current to be measured into the current-sensing resistor.

Furthermore, the current-sensing resistor according to the invention comprises, in accordance with the known current-sensing resistor described at the beginning, a second connection part which also consists of a conductor material (e.g. copper, copper alloy) and serves to lead the electric current to be measured out of the current-sensing resistor again.

Furthermore, the current-sensing resistor according to the invention also has, in accordance with the known current-sensing resistor described at the beginning, a resistor element which consists of a resistor material (e.g. Manganin®), the resistor element being arranged in the direction of current flow between the two connection parts, so that the electric current to be measured flows through the resistor element.

Furthermore, the current-sensing resistor according to the invention also has, in accordance with the known current-sensing resistor described at the beginning, at least one incision in at least one of the connection parts, the incision surrounding one of the voltage-sensing contacts and preventing a current flow across the incision. Such incisions are also referred to as current shadows and deform the equipotential lines and the current flow field within the current sensing resistor, which helps to improve measurement accuracy.

In contrast to the known current-sensing resistor described at the beginning, however, the current-sensing resistor according to the invention has several pairs of voltage-sensing contacts that are arranged in series in the direction of current flow and enable voltage measurement at different measurement points of the current-sensing resistor. Thus, several different measurement channels can be formed by using the voltage-sensing contacts in different pairs for voltage measurement.

In a preferred embodiment of the invention, the incision and the voltage-sensing contact surrounded by the incision are arranged centrally in the connection part with respect to the position transverse to the direction of current flow. In this way, the current-sensing resistor according to the invention also differs from the known current-sensing resistor described at the beginning, in which the incisions start from the side edge of the connection parts and are thus arranged close to the edge, i.e. not centrally.

It should be mentioned here that the current-sensing resistor has a certain central axis parallel to the direction of current flow, while the connection parts with the incision have a certain width transverse to the direction of current flow. The voltage-sensing contact surrounded by the incision preferably has an eccentricity with respect to the center axis of the current-sensing resistor which is smaller than 50%, 40%, 30%, 20%, 10% or even 5% of the width of the current-sensing resistor. The eccentricity in this sense is here the lateral distance between the center of the voltage-sensing contact surrounded by the incision on the one hand and the center axis of the current-sensing resistor on the other hand.

In the preferred embodiment of the invention, the incision in the connection part has a certain width transverse to the current flow direction, which is preferably at most 60%, 50% or even at most 40% of the width of the connection part.

In the case of the known current-sensing resistor described at the beginning, the incision (current shadow) in the connection parts is in each case arc-shaped, which can also be the case in the current-sensing resistor according to the invention. Preferably, however, the incision is U-shaped with a base transverse to the current flow direction and legs parallel to the current flow direction and facing the resistor element. Thus, the base of the U-shaped incision is located in the connection part, while the legs face the resistor element. Alternatively, however, it is also possible for the incision to be V-shaped.

Furthermore, it should be mentioned that the legs of the U-shaped or V-shaped incision perpendicular to the current flow direction preferably have a certain width which is at least as large as the thickness of the resistor element and/or the thickness of the connection parts and/or the thickness of the entire current-sensing resistor.

Furthermore, it should be mentioned that the base of the U-shaped incision parallel to the current flow direction has a certain width which is preferably also at least as large as the thickness of the resistor element and/or the thickness of the connection parts and/or the thickness of the entire current-sensing resistor.

Thus, in the base and in the legs of the U-shape, the incision is at least as wide as the thickness of the resistor element and/or the thickness of the connection parts and/or the thickness of the entire current-sensing resistor.

In the preferred embodiment of the invention, the legs of the U-shaped or V-shaped incision extend into the resistor element in the current flow direction and terminate in the resistor element. Thus, a part of the legs of the incision lies in the resistor element, while another part of the legs of the incision lies in the connector members. The leg length inside the resistor element can be, for example, 6 mm, with a maximum deviation of ±3 mm, ±2 mm, ±1 mm, ±0.5 mm or even ±0.2 mm. Furthermore, it should be mentioned that the leg length of the legs of the incision within the resistor element is preferably in the range of 10%-90%, 20%-80% or 30%-70% of the length of the resistor element in the current flow direction.

Alternatively, however, it is also possible within the scope of the invention for the legs of the incision to end in the connection part before the resistor element in the direction of current flow. In this case, the incision is thus located completely within the respective connection part and does not project into the resistor element. Here, the leg length of the incision can be, for example, 4 mm with a maximum deviation of ±2 mm, ±1 mm, ±0.5 mm or even ±0.2 mm. Furthermore, it should be mentioned here that the leg length can be in the range of 10%-90%, 20%-80% or 30%-70% of the width of the current sensing resistor.

In another alternative, on the other hand, the legs of the incision end in the direction of current flow exactly at the boundary between the resistor element and the connection part.

It has already been briefly mentioned above that the incision in the connection part surrounds a voltage-sensing contact and acts as a current shadow. The incision thus delimits a contact island in the remaining connection part, whereby the contact island between the incision and the resistor element preferably has an area of at least 4 mm², 5 mm², 6 mm², 8 mm² or 10 mm². The contact island is thus bounded on the one hand by the incision and on the other hand by the resistor element.

Furthermore, it should be mentioned that preferably at least one incision is arranged in each of the two connection parts, which surrounds a contact island for a voltage-sensing contact. In this case, the incisions are preferably located in pairs on opposite sides of the resistor element, and preferably in the same lateral position with respect to the center axis of the current-sensing resistor. However, it is alternatively also possible that the incisions are arranged offset in lateral direction on the two opposite sides of the resistor element.

Furthermore, within the scope of the invention, it is also possible that in at least one of the two connection parts, with respect to the direction of current flow, several incisions are arranged next to each other, each of which surrounds a contact island for a voltage-sensing contact. For example, in each of the two connection parts there may be arranged two incisions which are arranged symmetrically with respect to the center axis of the current-sensing resistor and with respect to the resistor element.

In one variant of the invention, the resistor element is divided in the lateral direction into a first part and a second part, so that the current to be measured is divided into a first current path through the first part and a second current path through the second part of the resistor element. This division is achieved by a cutout that prevents current from flowing across the cutout, so that the two current paths run on either side of the cutout. This cutout can, for example, consist of a punched-out section. It should be mentioned here that the cutout preferably extends in the direction of current flow over the entire length of the resistor element and can also extend into the connection parts.

In this invention variant, several voltage-sensing contacts can be arranged one behind the other in each of the two current paths, and preferably one behind the other along the current flow direction.

Furthermore, it is preferably provided that at least one pair of voltage-sensing contacts engages the two parts of the resistor element. For example, these voltage-sensing contacts can be arranged directly on the resistor element. In the preferred embodiment, however, these voltage-sensing contacts are arranged directly at the boundary to the resistor element on the respective connection part in order to measure the voltage drop between the two parts of the resistor element transverse to the direction of current flow.

In this invention variant with several parallel current paths, several voltage-sensing contacts can also be arranged next to each other in the two current paths with respect to the current flow direction. For example, the voltage-sensing contacts in the two current paths can each be arranged in matrix form in rows transverse to the current flow direction and tracks along the current flow direction.

It has already been briefly mentioned above that the conductor material can be, for example, copper or a copper alloy. Alternatively, however, it is also possible for the conductor material of the connection parts to be aluminum or an aluminum alloy. However, the invention is not limited to these materials with regard to the conductor materials used, but can also be realized with other materials which are electrically conductive. It should be mentioned, however, that the conductor material of the connection parts should have a smaller specific electrical resistance than the resistance material of the resistor element.

With regard to the resistive material of the resistor element, there are many possibilities within the scope of the invention. For example, the resistance material may be a copper alloy, in particular a copper-manganese-tin alloy or a copper-manganese-nickel alloy or a copper-chromium alloy. Another example of a basically suitable resistor material is a nickel alloy, such as nickel-chromium or copper-nickel.

It has already been briefly mentioned above that the resistor element is arranged between the two connection parts and is connected to the two connection parts. For example, this connection can be a welded connection (e.g. electron beam welding), such as is known from EP 0 605 800 A1.

The resistive material preferably has an electrical resistivity that is less than $2 \cdot 10^{-4}$ Ω·m, $2 \cdot 10^{-5}$ Ω·m or $2 \cdot 10^{-6}$ Ω·m.

Preferably, the resistive material has a resistivity that is greater than $2 \cdot 10^{-6}$ Ω·m, $2 \cdot 10^{-7}$ Ω·m, while the resistivity of the resistive material is preferably less than $10^{-6}$ Ω·m or $10^{-7}$ Ω·m.

In general, it should be mentioned that the current sensing resistor is preferably low resistance with a resistance value of at most than 1 μΩ, 10 μΩ, 50 μΩ, 100 μΩ, 500 μΩ, 10 mΩ, 5 mΩ, 2 mΩ or 1 mΩ.

Furthermore, it should be mentioned that the current-sensing resistor can have a current carrying capacity of at least 1 A, 10A, 100 A, 1 kA or 5 kA, based on continuous current load or pulse load.

With regard to the design of the current-sensing resistor, it should be mentioned that the resistor element and/or the connection parts can be plate-shaped, in particular as flat plates.

Regarding the dimensions, it should be noted that the current sensing resistor may have a length in the current flow direction that is smaller than 30 cm, 20 cm or 10 cm, while the width is preferably smaller than 20 cm, 10 cm or 5 cm. On the other hand, the thickness of the current sensing resistor is preferably smaller than 10 mm, 5 mm or 4 mm.

Furthermore, it should be mentioned that the two connection parts can each have at least one current connection for introducing or discharging the current, the individual current connections preferably each having at least one hole in the respective connection part, in particular two holes in each case, which are arranged next to one another with respect to the direction of current flow. Alternatively, the current connections can also consist of connection screws which project at right angles from the plate-shaped connection parts, as is known from EP 0 605 800 A1.

The aforementioned voltage-sensing contacts preferably each comprise contact islands consisting of an electrically conductive coating on the respective connection part. For example, the individual contact islands may each be substantially rectangular and comprise a coating of a different conductor material than the connection parts.

The contact islands can be arranged on the current-sensing resistor in matrix form in a plurality of, in particular four, rows perpendicular to the current flow direction and a plurality of, in particular three, tracks parallel to the current flow direction.

Furthermore, it should be mentioned that the invention does not only claim protection for the above-described current-sensing resistor according to the invention as a single component. Rather, the invention also claims protection for a complete current measuring device comprising such a current-sensing resistor and a voltage measuring device which serves for voltage measurement at the voltage-sensing contacts of the current-sensing resistor and supplies corresponding voltage measurement values, wherein the voltage measuring device can form several measuring channels. Furthermore, the current measuring device according to the invention preferably also comprises an evaluation unit for calculating the electric current flowing through the current-sensing resistor as a function of the voltage measurement values. Here, it is possible that the evaluation unit weights the various voltage measurement values with weighting factors. Furthermore, it is possible within the scope of the invention that the evaluation unit performs an automatic calibration, which is possible due to the multiple redundancy. In general, it should still be mentioned that the various voltage-sensing contacts can form a Wheatstones measurement bridge.

BRIEF DESCRIPTION OF THE DRAWINGS

Other advantageous further embodiments of the invention are indicated in the dependent claims or are explained in more detail below together with the description of the preferred embodiments of the invention with reference to the figures.

Finally.

DETAILED DESCRIPTION

Figure 1A:
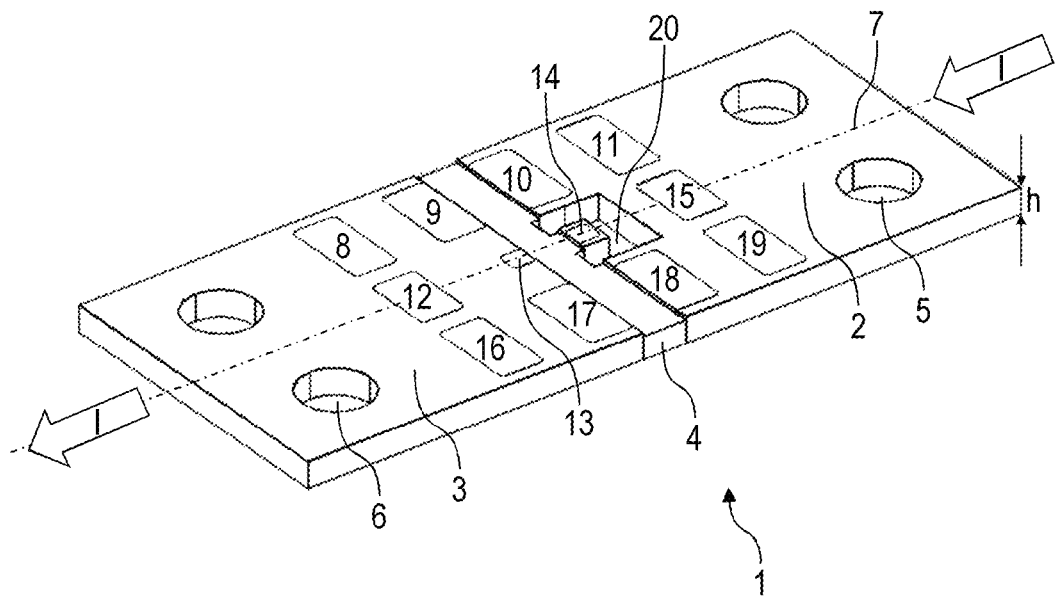
FIG. 1A shows a perspective view of a current-sensing resistor according to the invention.
Figure 1B:
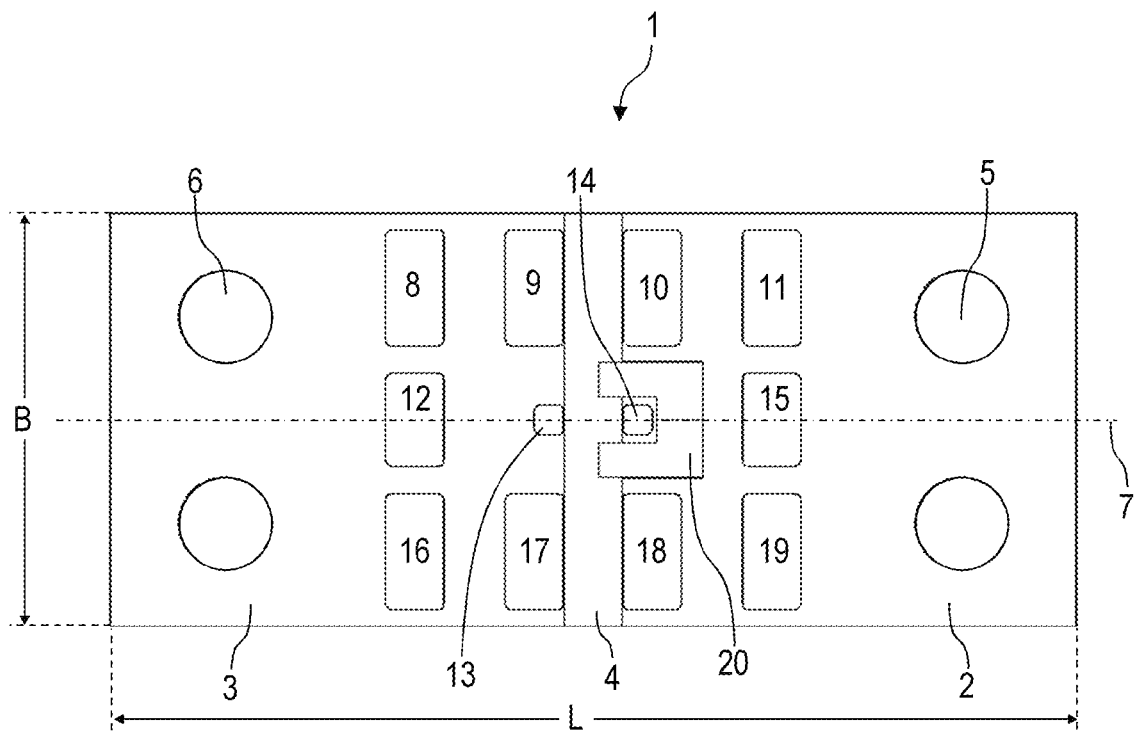
FIG. 1B shows a top view of the current-sensing resistor according to FIG. 1A.
Figure 1C:
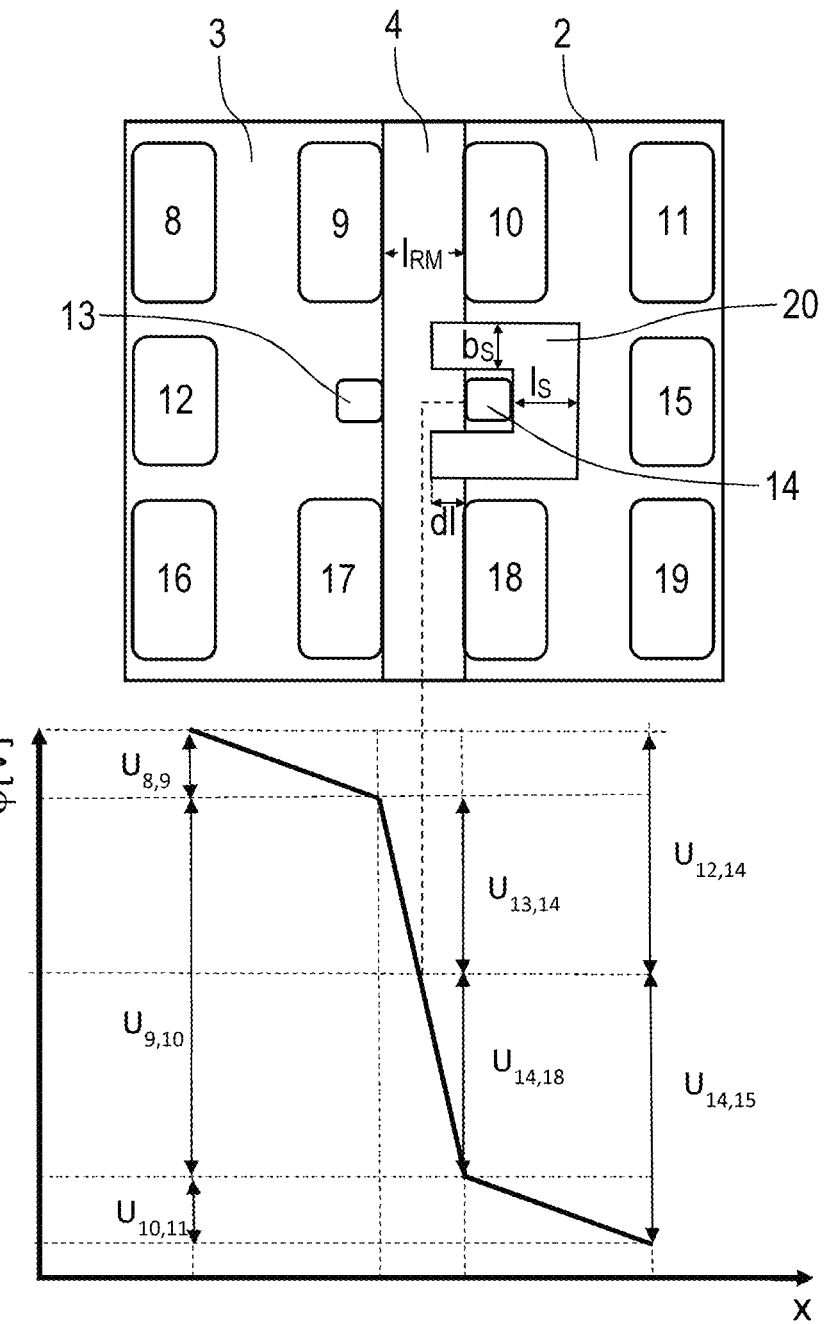
FIG. 1C shows an enlarged section of FIG. 1B with a voltage diagram.

In the following, a first embodiment of a current-sensing resistor 1 according to the invention will now be described, as shown in FIGS. 1A-1C. The current-sensing resistor 1 essentially consists of two connection parts 2, 3 made of a conductor material (e.g. copper) and a resistor element 4 made of a resistor material (e.g. Manganin®), the resistor element 4 being arranged in the direction of current flow between the two connection parts 2, 3, so that an electric current I to be measured is introduced into the current-sensing resistor 1 via the connection part 2, then flows through the resistor element 4 and is then discharged from the current-sensing resistor 1 again by the connection part 3. The electrical voltage dropping across the resistor element 4 is thus a measure of the electrical current I flowing through the current-sensing resistor 1 in accordance with Ohm's law, which enables current measurement in accordance with the four-wire technique known per se.

For the introduction and discharge of the electric current, the two connection parts 2, 3 each have current connections 5 and 6 in the form of two bores, which are arranged on both sides of a central axis 7 of the current-sensing resistor 1. The bores of the current connections 5 and 6 respectively enable the screwing on of corresponding contacts, as is known per se from the prior art.

The voltage measurement at the current-sensing resistor 1 is carried out by numerous voltage-sensing contacts 8-19, which are arranged on the two connection parts 2, 3 in matrix form in rows transverse to the current flow direction and tracks along the current flow direction. The voltage-sensing contacts 8-19 are each formed as rectangular contact islands consisting of a separate conductive coating applied to the respective connection parts 2 and 3. The voltage-sensing contacts 8-19 can be connected together in any pairings within the scope of the voltage measurement and thus form several voltage measuring channels.

The voltage-sensing contact 14 is surrounded by a U-shaped incision 20. First, the U-shaped incision 20 has a base within the connection part 2. Furthermore, the U-shaped incision 20 has two legs which extend in the direction of current flow and reach into the resistor element 4, as can be seen in particular in FIG. 1C. The legs of the U-shaped incision 20 have a width $b_s$ perpendicular to the current flow direction, while the base of the U-shaped incision 20 has a width $l_s$ along the current flow direction. Furthermore, it can be seen from FIG. 1C that the resistor element 4 has a width $I_{RM}$ along the current flow direction. Finally, it is also apparent from FIG. 1C that the legs of the U-shaped incision 20 within the resistor element 4 have a leg length dl.

The following dimensioning rules should be observed for the above quantities:

$$dl=0,1\text{-}0,9 \cdot I_{RM}$$

$$l_s \geq h$$

$$b_s \geq h$$

The current-sensing resistor 1 has a length L=80 mm along the direction of current flow and a width B=40 mm across the direction of current flow, while the thickness h=3 mm.

The potential diagram in FIG. 1C shows qualitatively the relationship of the voltage measurement values for different pairs of voltage-sensing contacts 8-19. The indices of the voltage values in the potential diagram correspond to the reference signs of the corresponding voltage-sensing contacts. The voltage value U1,2 thus designates the voltage between the voltage-sensing contacts 1 and 2.

Figure 2:
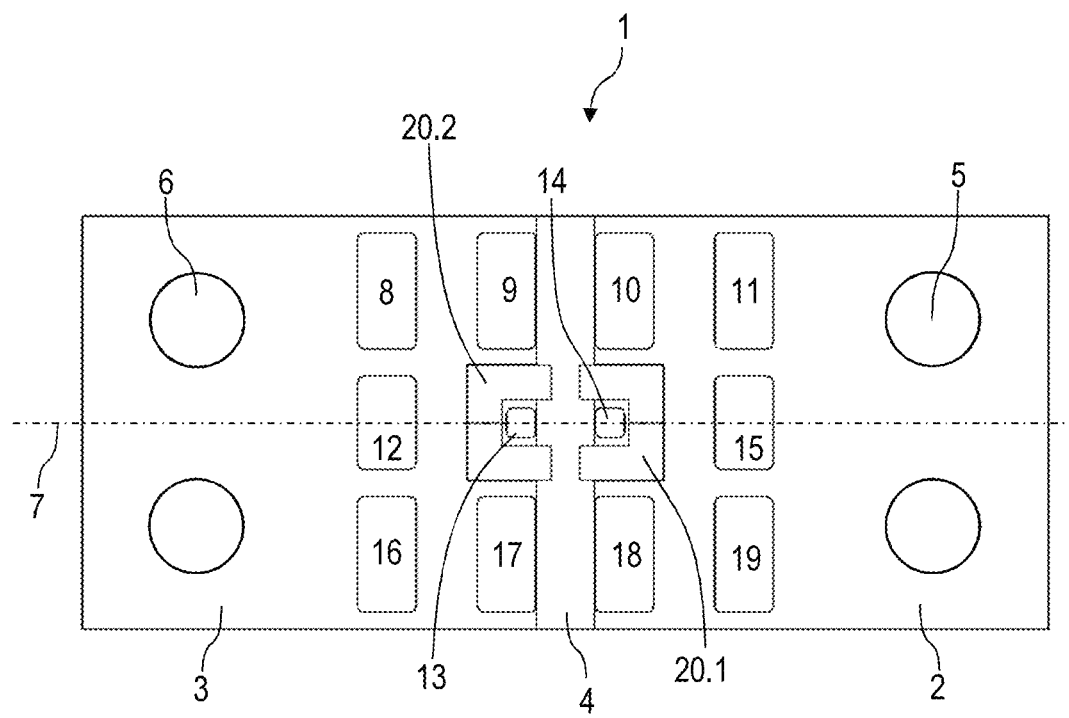
FIG. 2 shows a variation of FIG. 1B with two incisions in the two connection parts.

FIG. 2 shows a modification of the embodiment example according to FIGS. 1A-1C, so that in order to avoid repetition, reference is first made to the above description, with the same reference signs being used for corresponding details.

A special feature of this embodiment example is that the current-sensing resistor 1 has two incisions 20.1, 20.2 arranged in the two connection parts 2 and 3, respectively, on opposite sides of the resistor element 4.

Figure 3:
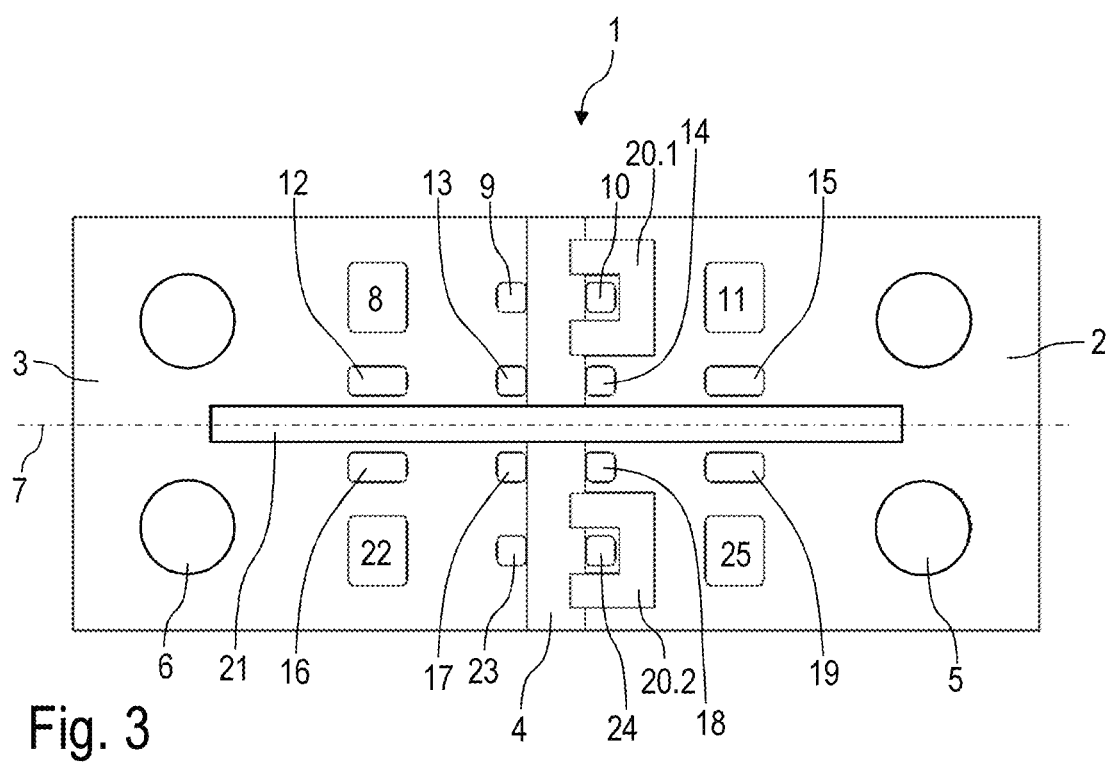
FIG. 3 shows a variation of the embodiment according to FIGS. 1A-1C with a cutout in the current sensing resistor to divide the current flow into two parallel current paths.

FIG. 3 shows a variation of the embodiments described above, so that to avoid repetition reference is again made to the above description, the same reference signs being used for corresponding details.

First of all, a special feature of this embodiment example is that the two incisions 20.1, 20.2 are not arranged on opposite sides of the resistor element 4, but on the same side of the resistor element 4, namely in the connection part 2.

A further special feature of this embodiment example is that the current-sensing resistor 1 has a incision 21 which extends along the center axis 7 of the current-sensing resistor 1 over the entire length of the resistor element 4 and extends into the adjacent connection parts 2 and 3, respectively. The incision 21 may, for example, consist of a protrusion and prevents current flow across the incision 21. The incision 21 thus divides the current I into two current paths on either side of the incision 21.

Furthermore, it should be mentioned that four additional voltage-sensing contacts 22-25 are provided in this embodiment example. The voltage-sensing contacts 8-25 are thus arranged in a matrix in four rows and four tracks.

Figure 4:
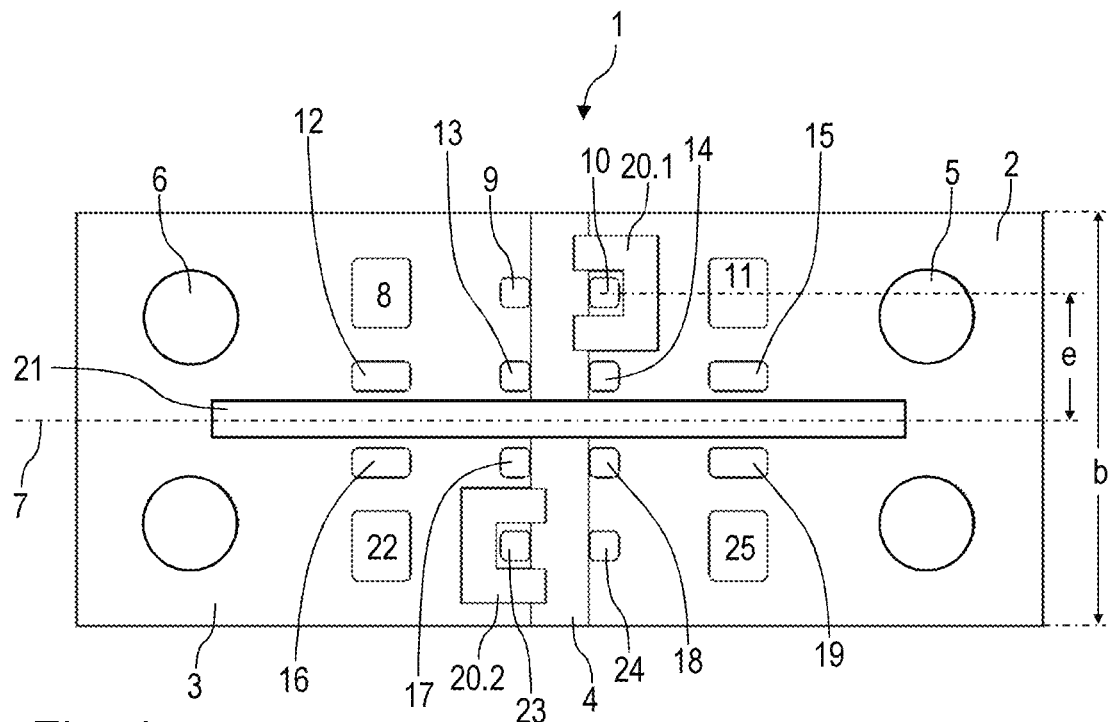
FIG. 4 shows a modification of FIG. 3.

FIG. 4 shows a variation of the embodiment example according to FIG. 3, so that in order to avoid repetition, reference is made to the above description, with the same reference signs being used for corresponding details.

It should be mentioned here that the incision 20.1 is arranged eccentrically with respect to the center axis 7 of the current-sensing resistor with a certain eccentricity e with respect to the center axis 7.

Figure 5:
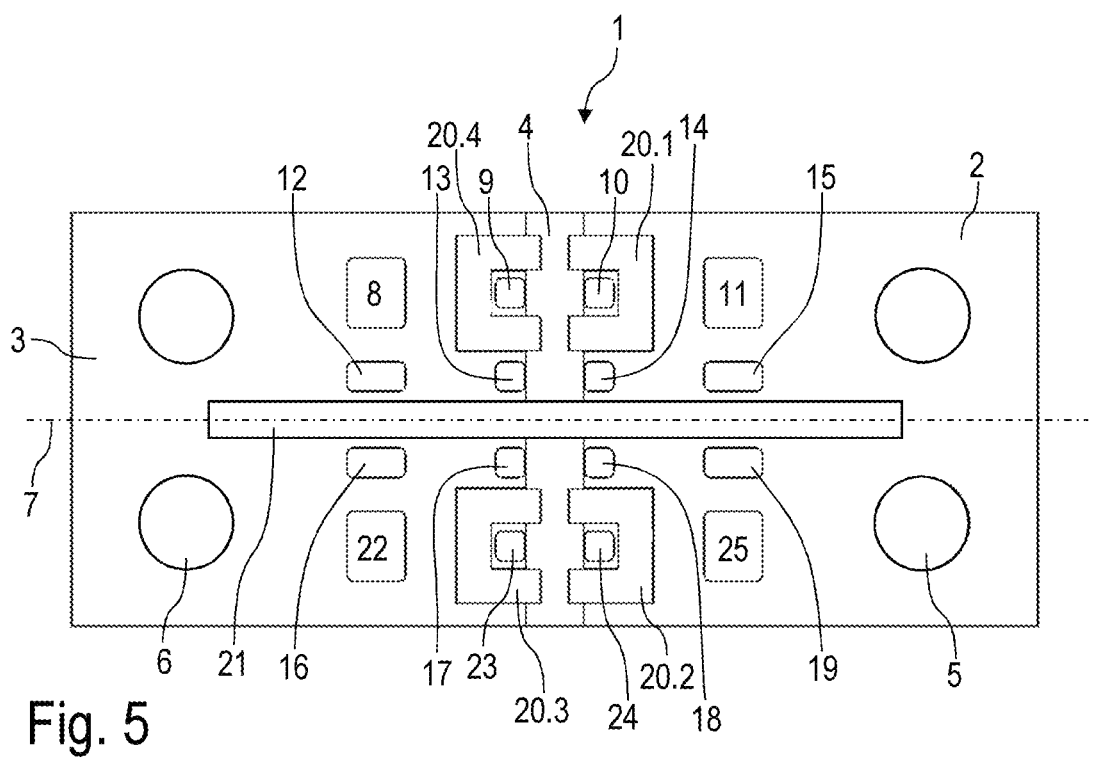
FIG. 5 shows a variation of FIG. 3.

FIG. 5 again shows a further modification of the embodiment example according to FIG. 3, so that in order to avoid repetitions, reference is again made to the above description, the same reference signs being used for corresponding details.

A special feature of this embodiment example is that a total of four incisions 20.1-20.4 are arranged in the current-sensing resistor 1.

Figure 6:
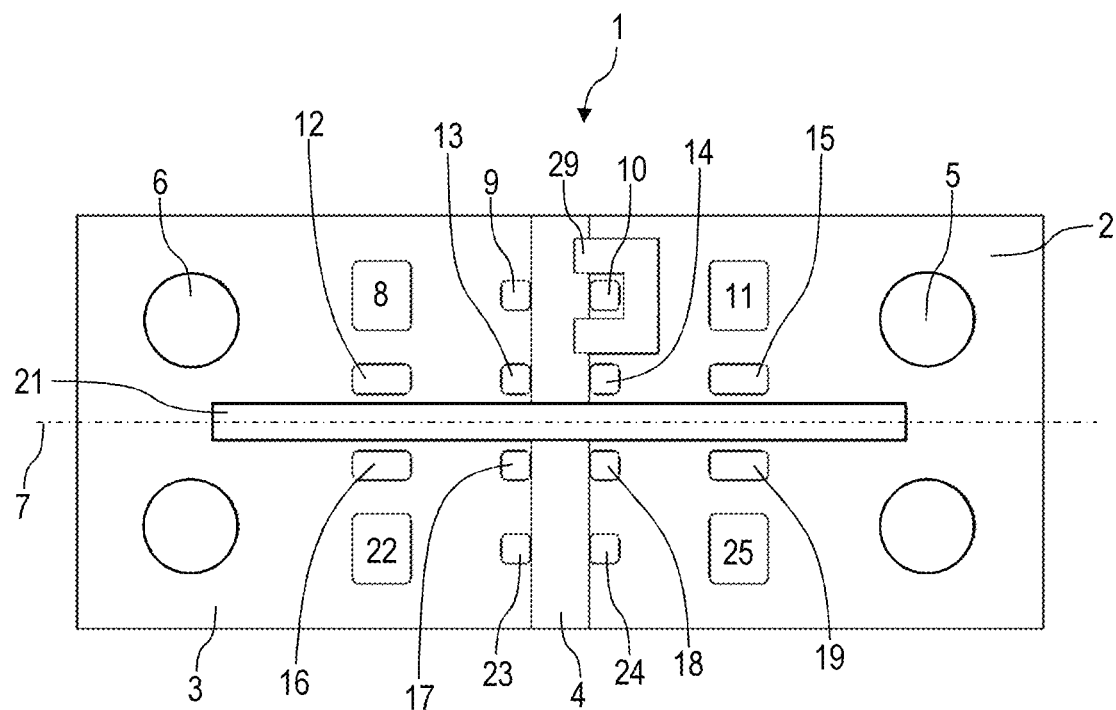
FIG. 6 shows a further variation of FIG. 3.

FIG. 6 shows a variation of the embodiment example according to FIG. 3, so that in order to avoid repetition, reference is made to the above description, with the same reference signs being used for corresponding details.

A special feature of this embodiment example is that there is only a single incision 20.

Figure 7:
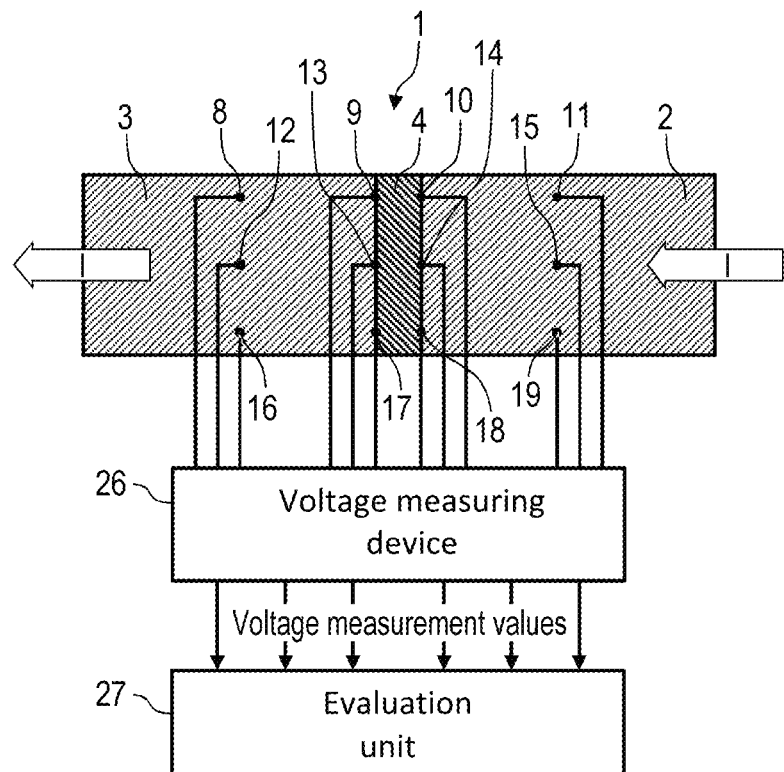
FIG. 7 shows a current measuring device with a current-sensing resistor according to the invention.

FIG. 7 shows a complete current measuring device with the current measuring stand 1 according to the invention and a voltage measuring device 26, which measures the voltage at the voltage-sensing contacts 8-19 in pairs and thus provides several measuring channels.

The measured voltage values are then forwarded to an evaluation unit 27, which calculates the electric current I from the measured voltage values, whereby the evaluation unit 27 can also weight the individual measured voltage values individually, whereby automatic calibration is also possible.

The invention is not limited to the preferred embodiments described above. Rather, the invention also enables a large number of variants and variations which also make use of the inventive concept and therefore fall within the scope of protection. In particular, the invention also claims protection for the subject-matter and the features of the dependent claims independently of the claims referred to in each case and, in particular, also without the technical teaching of the main claim. Thus, the invention comprises different aspects of the invention which enjoy protection independently of each other. For example, an independent aspect of the invention is the division of the current into two parallel current paths by means of the cutout running in the direction of current flow.

LIST OF REFERENCE SIGNS

1 Current sensing resistor
2, 3 Connection parts
4 Resistor element
5,6 Current connections (holes in the connection parts)
7 Center axis of the current-sensing resistor
8-19 Voltage-sensing contacts
20, 20.1-20.4 Incision
21 Cutout in the current-sensing resistor
22-25 Voltage-sensing contacts
26 Voltage measuring device
27 Evaluation unit
B Width of current-sensing resistor perpendicular to current flow direction
$b_s$ Width of the legs of the incision perpendicular to the current flow direction
$d_l$ Leg length of the legs of the incision within the resistor element
e Eccentricity of the incision
h Thickness of the current-sensing resistor
I Current
$I_{RM}$ Width of the resistor element along the current flow direction
$I_s$ Width of the base of the incision along the current flow direction
L Length of the current-sensing resistor along the current flow direction

What is claimed is:
1. A current-sensing resistor for measuring an electric current, having
    a) a first connection part made of a conductor material for introducing the electric current to be measured into the current-sensing resistor, b) a second connection part made of a conductor material for discharging the electric current to be measured from the current-sensing resistor, c) a resistor element made of a resistor material, the resistor element being arranged in the direction of current flow between the first connection part and the second connection part so that the current to be measured flows through the resistor element, d) at least one pair of voltage-sensing contacts for measuring a voltage drop across the resistor element, the voltage-sensing contacts each engaging one of the connection parts, and e) at least one incision in at least one of the connection parts, the incision surrounding one of the voltage-sensing contacts and preventing a current flow across the incision, f) wherein a plurality of pairs of voltage-sensing contacts are arranged one behind the other in the direction of current flow.

2. The current-sensing resistor according to claim 1, wherein the incision and the voltage-sensing contact surrounded by the incision are arranged centrally in the connection part with respect to the position transverse to the current flow direction.

3. The current-sensing resistor according to claim 1, wherein
a) the current-sensing resistor has a certain center axis parallel to the current flow direction,
b) the connection part with the incision has a certain width transverse to the current flow direction, and
c) the voltage-sensing contact surrounded by the incision has an eccentricity relative to the center axis of the current-sensing resistor which is smaller than 50% of the width of the current-sensing resistor.

4. The current-sensing resistor according to claim 1, wherein
a) the connection part with the incision has a certain width transverse to the current flow direction, and
b) the incision in the connection part extends transversely to the current flow direction over at most 60% of the width of the connection part.

5. The current-sensing resistor according to claim 1, wherein
a) the incision is arcuate, with a base transverse to the current flow direction and legs facing the resistor element parallel to the current flow direction,
b) the legs of the incision have a width perpendicular to the current flow direction which is at least as large as the thickness of the resistor element, and
c) the base of the incision has a width parallel to the current flow direction which is at least as large as the thickness of the resistor element.

6. The current-sensing resistor according to claim 5, wherein the legs of the incision project in the current flow direction into the resistor element and end in the resistor element.

7. The current-sensing resistor according to claim 5, wherein the legs of the incision end in the connection part in front of the resistor element in the current flow direction.

8. The current-sensing resistor according to claim 5, wherein the legs of the incision end in the direction of current flow at the boundary between the resistor element and the connection part.

9. The current-sensing resistor according to claim 1, wherein the incision in the connection part delimits a contact island, the contact island between the incision and the resistor element having an area of at least 4 mm$^2$.

10. The current-sensing resistor according to claim 1, wherein
a) at least one incision is arranged in each of the two connection parts, which incision surrounds a contact island for a voltage-sensing contact, and
b) the incisions are arranged in pairs on opposite sides of the resistor element in the connection parts, namely in the same late-running position with respect to the central axis of the current-sensing resistor.

11. The current-sensing resistor according to claim 1, wherein in at least one of the two connection parts a plurality of incisions are arranged next to one another with respect to the direction of current flow, which incisions each surround a contact island for a voltage-sensing contact.

12. The current-sensing resistor according to claim 1, wherein
a) the resistor element is divided into a first part and a second part, so that the current to be measured is divided into a first current path through the first part and a second current path through the second part of the resistor element,
b) a cutout is provided in the resistor element which prevents current flowing across the cutout, so that the two current paths run on either side of the cutout,
c) the cutout extends in the direction of current flow preferably over the entire length of the resistor element, and
d) the cutout preferably extends in the direction of current flow into the connection parts.

13. The current-sensing resistor according to claim 12, wherein
a) in the first current path in each case a plurality of voltage-sensing contacts are arranged one behind the other along the direction of current flow,
b) in the second current path in each case a plurality of voltage-sensing contacts are arranged one behind the other along the current flow direction, and
c) a pair of voltage-sensing contacts engages on the two parts of the resistor element in order to measure the voltage drop between the two parts of the resistor element transversely to the current flow direction.

14. The current-sensing resistor according to claim 12, wherein
a) in the first current path in each case a plurality of voltage-sensing contacts are arranged side by side transversely to the direction of current flow,
b) in the second current path in each case a plurality of voltage-sensing contacts are arranged side by side transversely with respect to the current flow direction, and
c) in each case a plurality of voltage-sensing contacts are arranged on the two parts of the resistor element, namely transversely to the current flow direction next to one another.

15. The current-sensing resistor according to claim 1, wherein
a) the conductor material is copper, a copper alloy, aluminum or an aluminum alloy,
b) the conductor material of the connection parts has a smaller specific electrical resistance than the resistance material of the resistor element,
c) the resistor element is electrically and mechanically connected to the two connection parts by a welded joint,
d) the resistance material has a specific electrical resistance which is less than $2 \cdot 10^{-4}$ Ω·m, e) the resistive material has an electrical resistivity greater than $2 \cdot 10^{-6}$ Ω·m, f) the conductor material has a specific electrical resistance which is smaller than $10^{-6}$ Ω·m, g) that the resistance is low resistance with a resistance value of at most than 1 μΩ, h) the resistor element is plate-shaped, i) the connection parts are each plate-shaped, j) the current-sensing resistor has a length in the current flow direction which is less than 30 cm, k) the current-sensing resistor has a width at right angles to the current flow direction which is smaller than 20 cm, and l) The current-sensing resistor has a thickness which is smaller than 10 mm.

16. A current measuring device, comprising:

a) the current-sensing resistor according to claim 1, b) a voltage measuring device for voltage measurement at the voltage-sensing contacts of the current-sensing resistor and for determining corresponding voltage measurement values, and c) an evaluation unit for determining the current flowing through the current-sensing resistor from the voltage measurement values.

17. The current measuring device according to claim 16, wherein the voltage-sensing contacts form a Wheatstone measuring bridge.

18. The current measuring device according to claim 17, wherein the voltage-sensing contacts form several redundant current measuring channels.

* * * * *